United States Patent

(12) United States Patent
Goodbread et al.

(10) Patent No.: US 6,670,824 B2
(45) Date of Patent: Dec. 30, 2003

(54) INTEGRATED POLYSILICON FUSE AND DIODE

(75) Inventors: Jon Goodbread, Thornton, CO (US);
John Stanback, Ft. Collins, CO (US);
Chris Feng, Windsor, CO (US); Molly Johnson, Greeley, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/103,495

(22) Filed: Mar. 20, 2002

(65) Prior Publication Data

US 2003/0179011 A1 Sep. 25, 2003

(51) Int. Cl.$^7$ ............................................... H03K 19/177
(52) U.S. Cl. ............................. 326/39; 326/44; 327/525
(58) Field of Search ....................... 326/37–41; 327/525

(56) References Cited

U.S. PATENT DOCUMENTS

| | | | | |
|---|---|---|---|---|
| 5,536,968 A | * | 7/1996 | Crafts et al. | 257/529 |
| 5,780,918 A | * | 7/1998 | Aoki | 257/529 |
| 6,410,367 B2 | * | 6/2002 | Marr et al. | 438/132 |
| 6,452,248 B1 | * | 9/2002 | Le | 257/530 |

OTHER PUBLICATIONS

Alexander Kalnitsky, Irfan Saadat, Albert Bergemont and Pascale Francis, "CoSi2 Integrated fuses on poly silicon for low voltage 0.18 μm CMOS Application", National Semiconductor, Santa Clara, CA 95052, 0–7803–5413–399, (1999), 4 pages.

Mohsen Alavi, Mark Bohr, Jeff Hicks, Martin Denham, Allen Cassens, Dave Douglas, Min–Chun Tsai, "A PROM Element Based on Salicide Agglomeration of Poly Fuses in a CMOS Logic Process", IEEE International Electron Devices Meeting (Dec. '97), 4 pages.

Jerome B. Lasky, James S. Nakos, Orison J. Cain, and Peter J. Geiss, "Comparison of Transformation to Low–Resistivity Phase and Agglomeration of TiSi2 and CoSi2", IEEE Transactions on Electron Devices, vol. 38, No. 2, Feb. 1991, pp. 262–269.

\* cited by examiner

*Primary Examiner*—Don Le

(57) ABSTRACT

An integrated polysilicon fuse and diode and methods of making the same are provided. The integrated polysilicon fuse and diode combination may be implemented in a programmable cross point fuse array. The integrated polysilicon fuse and diode may be used in a random access memory (RAM) cell. The polysilicon diode may be isolated from a substrate and other devices, use less area on a substrate, and cost less to manufacture compared to other diodes.

19 Claims, 4 Drawing Sheets

Fuse

Poly Lateral Diode

INTEGRATED POLYSILICON FUSE AND DIODE

FIELD OF THE INVENTION

The present invention relates to integrated circuits, and more particularly to fuses and diodes.

BACKGROUND OF THE INVENTION

Some CMOS integrated circuit processes have tried to form a one-time programmable element called a "poly fuse." A poly fuse may comprise a Co, Ti or other metal layer formed on a polysilicon layer, such as a LPCVD poly film. The LPCVD poly film may be doped/implanted with a contaminant to lower the bulk resistivity. The metal layer is silicided with some of the poly layer, and the result is a silicided polysilicon layer (also called a "polysilicide") over an unsilicided polysilicon layer.

Some processes "program" a poly fuse by passing a sufficiently high current through the silicided polysilicon (fuse material). The current heats the silicide such that the temperature rises above a certain critical temperature where the silicide changes phase and increases in resistance. The change of phase may increase the density and be accompanied by a clustering or agglomeration of the silicided doped polysilicon molecules, which can form voids in the silicide layer, and thus increase the resistance substantially. The phase change may reduce one or more geometric dimensions of the silicided polysilicon. In some cases, the reduced dimensions may cause the silicided polysilicon film to separate at or physically move away from a junction of highest heat dissipation, which can be ascertained by post-processing physical analysis. The amount of silicide agglomeration may vary from fuse to fuse. The process of applying current to change the silicided polysilicon from a relatively low resistance state to a relatively high resistance state may be referred to as "programming" the fuse.

SUMMARY OF THE INVENTION

The invention recognizes that a standard CMOS integrated circuit process does not have the capability of creating diodes that are sufficiently isolated from the substrate, unless additional mask and implant steps are added. The invention also recognizes that one-time programmable elements, such as silicided poly fuses, may be used as programmable elements in a wide range of integrated circuit applications.

An integrated polysilicon fuse and diode circuit and methods of making the same are provided in accordance with the present invention. The integrated polysilicon fuse and diode combination described herein may be implemented in a programmable cross point fuse array. The integrated poly fuse and diode may advantageously be used in a nonvolatile, random access memory (RAM) cell/element. The poly fuse and diode described herein are less expensive to manufacture than other types of nonvolatile memory elements, such as FERAM and MRAM, which may require adding process steps to a standard CMOS process. As an example, the poly fuse and diode may be used to store a serial or part number of a device, such as a computer mouse.

Compared to other types of diodes that may be used in a memory array with fuses as the memory element, the polysilicon diode described herein may be isolated from a substrate and from other devices, use less area on a substrate, and cost less to manufacture.

DETAILED DESCRIPTION

The CMOS process according to one embodiment of the invention may advantageously include all features or comply with all process conditions of a standard state-of-the-art 0.18, 0.13 CMOS process or other CMOS processes. These conditions may include rapid thermal anneal (RTA) conditions and silicidation temperatures and time periods to form transistors.

Programmable Fuse Array

Figure 1:
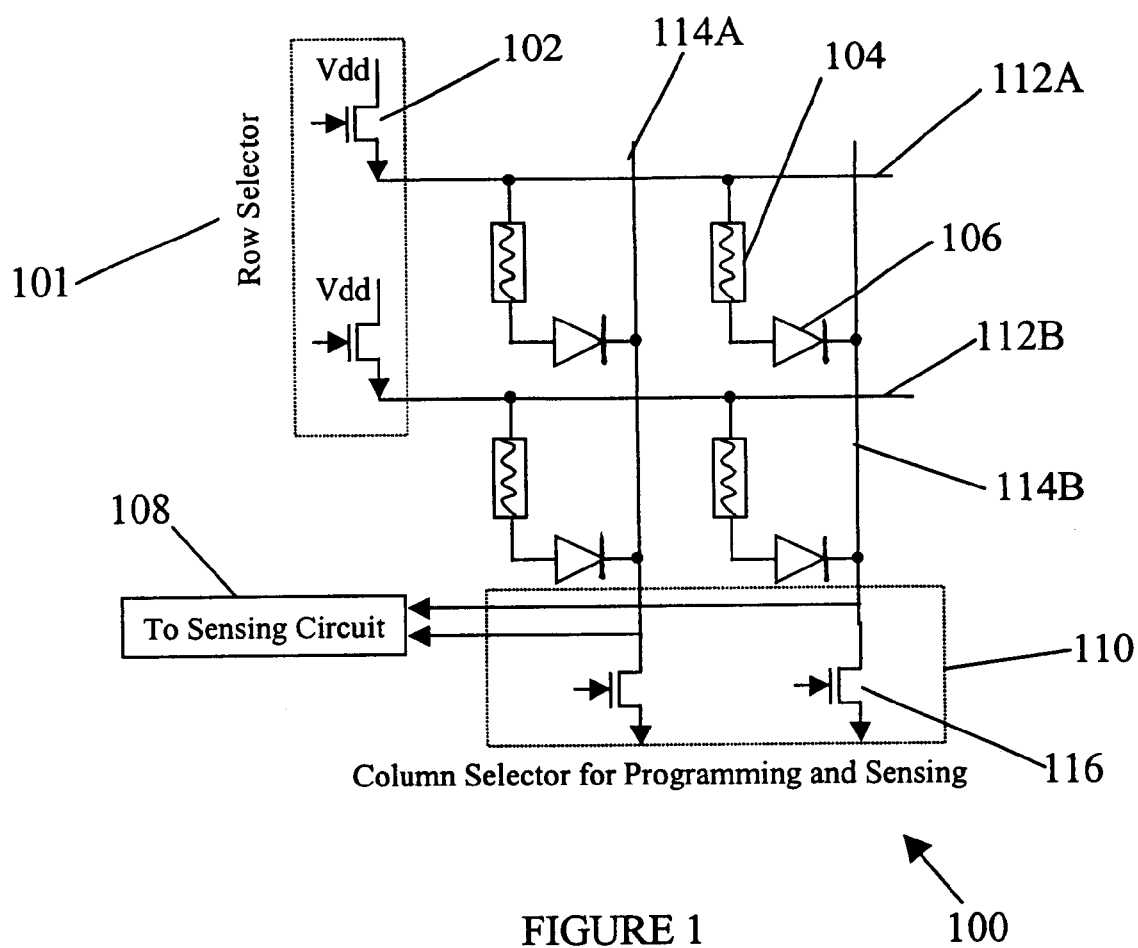
FIG. 1 illustrates one embodiment of a programmable cross point fuse array.

FIG. 1 illustrates one embodiment of a programmable cross point fuse array 100. The fuse array 100 comprises a row selector 101, a plurality of row lines 112A, 112B, a column selector 110, a plurality of column lines 114A, 114B, a plurality of polysilicon fuses ("poly fuses"), such as the fuse 104, and a plurality of polysilicon diodes ("poly diodes"), such as the diode 106. The row selector 101 comprises a plurality of row selection transistors, such as the transistor 102 for row 112A. The column selector 110 comprises a plurality of column selection transistors, such as the transistor 116 for column 114B. The column selector 110 may be coupled to a sensing circuit 108. The column selector 110 may be used to program fuses at cross points and to sense programmed fuses at cross points.

In general, the fuse array 100 in FIG. 1 may comprise any number of row lines, column lines, row selection transistors, column selection transistors, fuses and diodes. The fuse array 100 may comprise other elements (not shown) in addition to or instead of the elements shown in FIG. 1.

In FIG. 1, a fuse 104 is in series with a diode 106 at a row-column cross point. The diode 106 is configured to isolate the fuse 104 from undesired current. If a fuse 104 is not "blown" during programming (i.e., silicided poly is not subjected to a current that causes a phase change), the fuse 104 and diode 106 are configured to couple the row line 112A to the column line 114B. The sensing circuit 108 may sense this row-column connection when the row selection transistor 102 and column selection transistor 116 are activated.

If the fuse 104 is blown during programming (i.e., silicided poly experiences A phase change and possibly agglomeration), the relatively higher resistance of the blown fuse indicates that the row line 112A should not be coupled to the column line 114B. The resistances of blown fuses may vary considerably from one blown fuse to another blown fuse (this may be a result of different amounts of phase change and silicide agglomeration). In one embodiment, the resistance of the blown/programmed fuse is about more than 6 times higher than the resistance of the unprogrammed fuse.

One advantage of the cross point fuse array 100 in FIG. 1 is having a transistor control an entire row or an entire column, rather than having programming transistors (e.g., NMOS transistors) control each cross point. Using a fuse 104 and diode 106, instead of using a programming transistor, to control each cross point may reduce the complexity, cost of manufacturing and size of a cross point circuit.

Polysilicon Fuse

Figure 2:
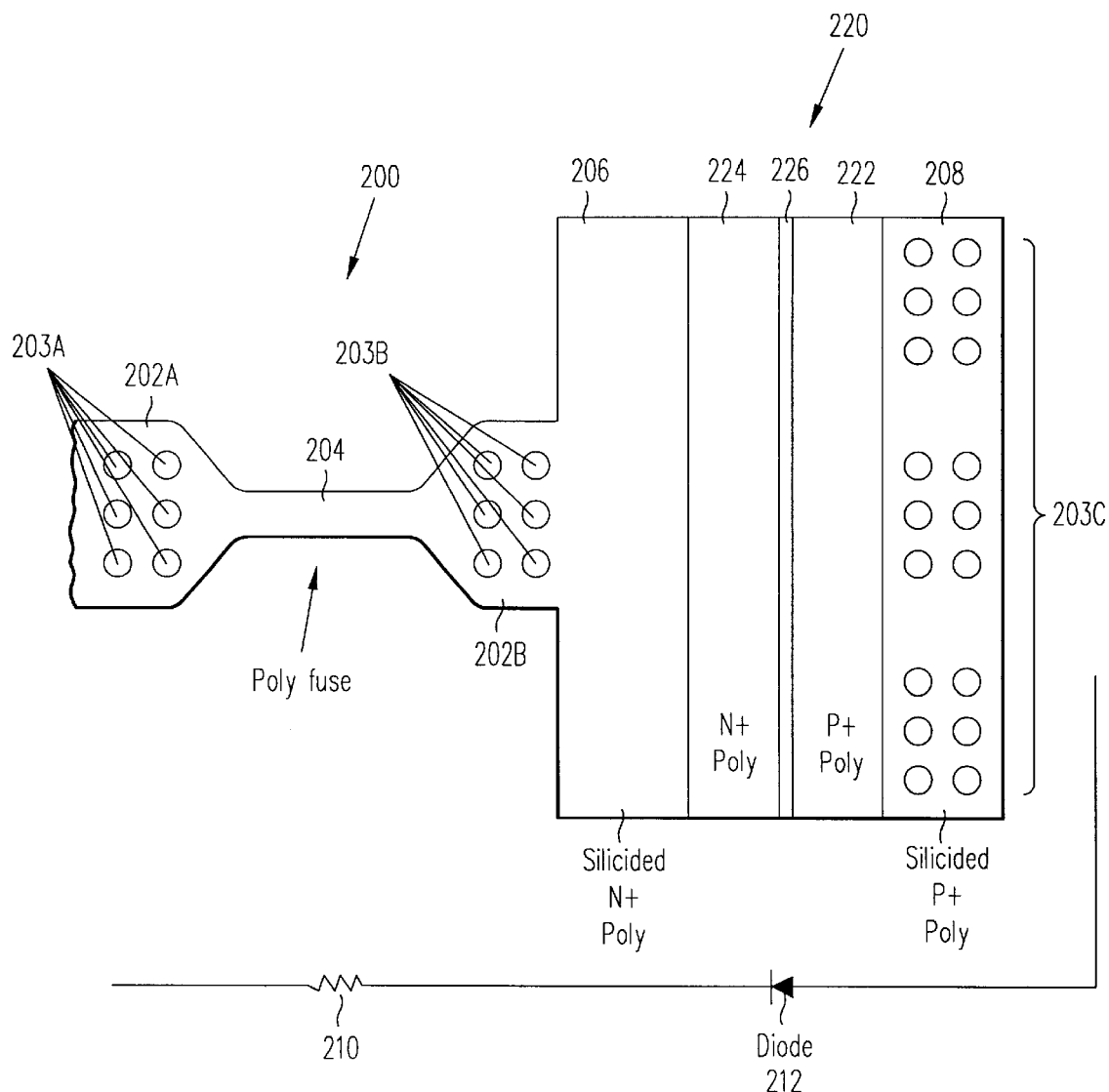
FIG. 2 is a top view of one embodiment of a polysilicon fuse and a polysilicon diode that may be implemented in the fuse array of FIG. 1.

FIG. 2 is a top view of one embodiment of a polysilicon fuse 200 and a polysilicon diode 220 that may be implemented in the fuse array 100 of FIG. 1. The fuse 200 in FIG. 2 comprises a link 204 and two contact areas 202A, 202B with a plurality of contact plugs 203A, 203B (also called "contact pads"). The fuse 200 may be called a "poly fuse" and may be formed during a standard or modified CMOS integrated circuit process. Specifically, a Co, Ti or other metal layer is formed and silicided on a polysilicon layer in the shape of a "line" or link 204. As a result, the link 204 of an unprogrammed fuse 200 comprises a silicided polysilicon (also called a "polysilicide") layer, e.g., a $TiSi_2$ or $CoSi_2$, over a remaining polysilicon layer.

One contact area 202A of the fuse 200 or the plugs 203A of the contact area 202A may be coupled to a row line 112 in the cross point fuse array 100 in FIG. 1. The other contact area 202B may be proximate to a silicided N+ doped polysilicon area 206, which is proximate to an N+ doped polysilicon area 224 of the diode 220.

The diode 220 has contact plugs/pads 203C in area 208 such that the contact pads 203A and 203C may function together to supply current or test the voltage across the fuse 200 and diode 220. Although 18 plugs/pads 203C are shown in FIG. 2, there may be any suitable number of plugs/pads 203C depending on the size of the area 208. In one embodiment, the fuse 200 in FIG. 2 has contact plugs/pads 203A and 203B for testing the fuse 200 before and/or after programming. In another embodiment, the fuse 200 does not have contact plugs 203B.

Figure 3A:
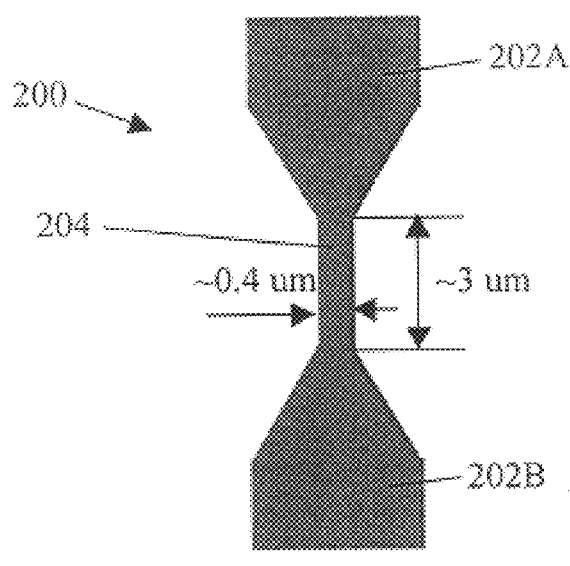
FIG. 3A is a top view of one embodiment of the polysilicon fuse in FIG. 2.

FIG. 3A is a top view of one embodiment of the polysilicon fuse 200 in FIG. 2. In one embodiment, the link 204 in FIG. 3A is about 3 μm in length and about 0.4 μm in width, but other shapes and sizes may be used.

Polysilicon Diode

The diode 220 in FIG. 2 comprises a silicided N+ doped polysilicon area 206, a N+ doped polysilicon area 224, a silicide block 226, a P+ doped polysilicon area 222 and a silicided P+ doped polysilicon area 208. The diode 220 may be formed in a standard polysilicon layer of a CMOS process. For example, a polysilicon layer may be formed over a non-conductor or a standard "field oxide" layer, such as a silicon dioxide or nitride layer, which is formed over a substrate. P+ source and drain mask and implant steps of a CMOS process may form the P+ doped polysilicon area 222 of the diode 220. Similarly, N+ source/drain mask and implant steps of the CMOS process may form the N+ doped polysilicon area 224 of the diode 220. The underlying field oxide layer isolates or insulates the polysilicon diode 220 from the silicon substrate and other devices.

The silicide block 226 of the diode 220 may comprise a thin layer of silicon nitride. The silicide block 226 is configured to block the formation of silicide in the region where the N+ and P+ implanted polysilicon areas 224, 222 are adjacent. The silicide formation (e.g., $TiSi_2$ or $CoSi_2$) of the fuse 200 should be blocked from the poly diode 220, or else the silicide formation of the fuse 200 may short out the diode 220.

The diode 220 may be referred to as a "lateral" polysilicon diode because current flows laterally from the P+ doped polysilicon area 222 to the N+ doped polysilicon area 224. In contrast, current usually flows vertically in most bulk silicon diodes, where the current can flow from the bottom of a diffused layer into the substrate (or into another diffused layer).

Figure 3B:
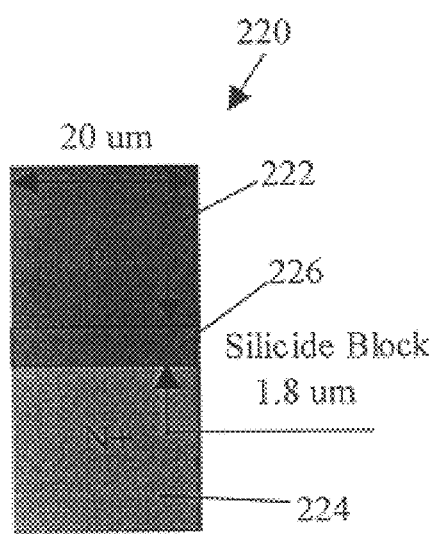
FIG. 3B is a top view of one embodiment of the polysilicon diode in FIG. 2.

FIG. 3B is a top view of one embodiment of the polysilicon diode 220 in FIG. 2. In one embodiment, the diode 220 in FIG. 3B is about 20 μm in length and the silicide block 226 is about 1.8 μm in width. In one embodiment, the poly lateral diode 220 has a width of 20 μm and behaves like a regular diode with a reverse bias breakdown voltage greater than about 6 V. In one embodiment, the breakdown voltage of the diode 220 should be higher than the power supply voltage.

Programming the Fuse

Some processes "program" a poly fuse by passing a sufficiently high current through the silicided polysilicon (fuse material). The current heats the silicide such that the temperature rises above a certain critical temperature where the silicide changes phase and increases in resistance. The change of phase may increase the density and be accompanied by a clustering or agglomeration of the silicided doped polysilicon molecules, which can form voids in the suicide layer, and thus increase the resistance substantially. The phase change may reduce one or more geometric dimensions of the silicided polysilicon. In some cases, the reduced dimensions may cause the silicided polysilicon film to separate at or physically move away from a junction of highest heat dissipation, which can be ascertained by post-processing physical analysis. The amount of silicide agglomeration may vary from fuse to fuse. The process of applying current to change the silicided polysilicon from a relatively low resistance state to a relatively high resistance state may be referred to as "programming" the fuse.

The power needed for programming a fuse may depend on the fuse configuration and any elements, such as a diode 220, in series with the fuse.

Figure 4:
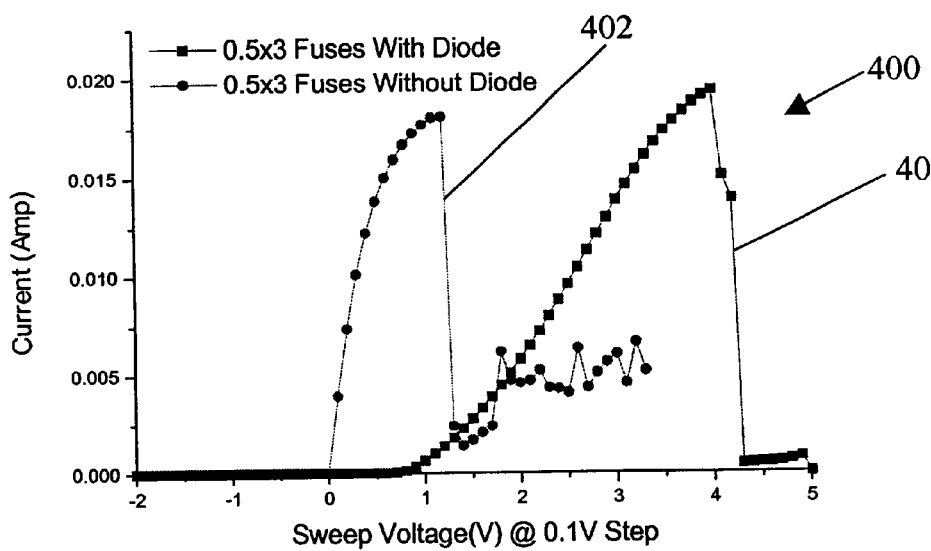
FIG. 4 illustrates an example of a voltage vs. current programming curve for a fuse with a diode, such as the fuse and diode in FIG. 2, and a voltage vs. current programming curve for a fuse without a diode.

FIG. 4 illustrates an example of a voltage vs. current programming curve 404 for a fuse with a diode, such as the fuse 200 and diode 220 in FIG. 2, and a voltage vs. current programming curve 402 for a fuse without a diode. FIG. 4 demonstrates that adding a lateral poly diode 220 (FIG. 2) in series with a poly fuse 200 may increase the programming voltage from about 1.2 V to about 4.2 V (a difference of about 3 V) because of the series resistance of the polysilicon diode 220. In this example, the resistance of the diode 220 is responsible for a 3-volt voltage drop across the diode 220, which raises the programming voltage of the fuse 200 by 3 volts.

After a poly fuse is programmed, the resistance of the programmed fuse may be about three to about ten times higher than the resistance of an unprogrammed fuse.

The above-described embodiments of the present invention are merely meant to be illustrative and not limiting. Various changes and modifications may be made without departing from the invention in its broader aspects. The appended claims encompass such changes and modifications within the spirit and scope of the invention.

What is claimed is:

1. A circuit formed with a CMOS process, the circuit comprising:
    a polysilicon fuse comprising a silicided polysilicon layer, the fuse being configured to be programmed; and a polysilicon diode proximate to the polysilicon fuse, the diode comprising a N+ doped polysilicon area and a P+ doped polysilicon area, the diode being configured to prevent current from entering one end of the fuse.

2. The circuit of claim 1, wherein the fuse is in series with the diode.

3. The circuit of claim 1, wherein the fuse is configured to be programmed by applying an electric current that causes the silicided polysilicon layer to change phase.

4. The circuit of claim 1, wherein the fuse comprises a programmable link and two contact areas.

5. The circuit of claim 1, wherein the diode is formed by forming a non-conductive layer over a substrate;

forming a polysilicon layer over the non-conductive layer;

masking and implanting P+ dopants into an area of the polysilicon layer to form the P+ doped polysilicon area; and masking and implanting N+ dopants into another area of the polysilicon layer to form the N+ doped polysilicon area.

6. The circuit of claim 5, wherein the non-conductive layer isolates the diode from the substrate.

7. The circuit of claim 5, wherein the non-conductive layer isolates the diode from other structures.

8. The circuit of claim 5, wherein the non-conductive layer comprises a silicon dioxide layer.

9. The circuit of claim 5, wherein the non-conductive layer comprises a nitride layer.

10. The circuit of claim 1, wherein the diode further comprises a silicided N+ doped polysilicon area and a silicided P+ doped polysilicon area.

11. The circuit of claim 1, wherein the diode further comprises a silicide block proximate to a junction of the N+ doped polysilicon area and the P+ doped polysilicon area.

12. The circuit of claim 11, wherein the silicide block comprises a thin layer of silicon nitride.

13. The circuit of claim 11, wherein the silicide block is configured to block formation of silicide at a junction of the N+ doped area and the P+ doped area.

14. The circuit of claim 1, wherein the diode is a lateral diode configured to allow current to flow laterally from the P+ doped polysilicon area to the N+ doped polysilicon area.

15. The circuit of claim 1, being implemented in a random access memory (RAM) cell, the fuse being configured to be programmed by applying a current to cause a phase change in a silicided polysilicon layer of the fuse.

16. A programmable cross point fuse array comprising:

a plurality of row lines;

a plurality of column lines;

a polysilicon fuse coupled to a row line; and a doped polysilicon diode coupled to the fuse and a column line, the fuse and diode being configured to couple a row line with a column line, the fuse being configured to be programmed by applying a current to cause a phase change in a silicided polysilicon layer of the fuse.

17. The fuse array of claim 16, further comprising:

a row selection circuit coupled to a row and configured to activate the row when the row selection circuit is activated; and a column selection circuit coupled to a column and configured to activate the column when the column selection circuit is activated.

18. A method of forming a programmable integrated circuit, the method comprising:

forming a non-conductive layer over a substrate;

forming a polysilicon layer over the non-conductive layer;

masking and implanting P+ dopants into an area of the polysilicon layer to form a P+ doped polysilicon area; and masking and implanting N+ dopants into another area of the polysilicon layer to form a N+ doped polysilicon area, wherein the P+ doped polysilicon area and the N+ doped polysilicon area form a polysilicon diode.

19. The method of claim 18, further comprising:

forming a metal layer over another area of the polysilicon layer; and siliciding the metal layer over the polysilicon layer to form a polysilicon fuse.

* * * * *

UNITED STATES PATENT AND TRADEMARK OFFICE
CERTIFICATE OF CORRECTION

PATENT NO. : 6,670,824 B2
DATED : December 30, 2003
INVENTOR(S) : Johnson, Martha It is certified that error appears in the above-identified patent and that said Letters Patent is hereby corrected as shown below:

<u>Title page,</u>
Item [75], Inventors, add first name -- Martha -- to "Johnson"

Signed and Sealed this

Eighteenth Day of May, 2004

JON W. DUDAS
*Acting Director of the United States Patent and Trademark Office*